(12) United States Patent
Kang et al.

(10) Patent No.: US 12,341,124 B2
(45) Date of Patent: Jun. 24, 2025

(54) SOLDER REFLOW APPARATUS

(71) Applicant: Samsung Electronics Co., Ltd., Suwon-si (KR)

(72) Inventors: Byungkeun Kang, Suwon-si (KR); Chaein Moon, Suwon-si (KR); Youngja Kim, Suwon-si (KR); Youngmin Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 18/337,860

(22) Filed: Jun. 20, 2023

(65) Prior Publication Data

US 2024/0128229 A1    Apr. 18, 2024

(30) Foreign Application Priority Data

Oct. 17, 2022   (KR) ........................ 10-2022-0133177

(51) Int. Cl.
| | |
|---|---|
| *B23K 3/00* | (2006.01) |
| *B23K 3/08* | (2006.01) |
| *B23K 37/00* | (2025.01) |
| *B23K 37/04* | (2006.01) |
| *H01L 23/00* | (2006.01) |

(52) U.S. Cl.
CPC .............. *H01L 24/75* (2013.01); *B23K 3/087* (2013.01); *B23K 37/04* (2013.01); *H01L 2224/75272* (2013.01); *H01L 2224/75704* (2013.01); *H01L 2224/75803* (2013.01); *H01L 2224/75804* (2013.01); *H01L 2924/40* (2013.01)

(58) Field of Classification Search
CPC ........... H01L 24/75; H01L 2224/75272; H01L 2224/75704; H01L 2224/75803; H01L 2224/75804; H01L 2924/40; H05K 3/3494; B23K 1/0016; B23K 1/00-206; B23K 3/00-087; B23K 37/04-047; B23K 2101/36-42
USPC .............. 228/179.1-180.22, 47.1-49.5, 44.7
See application file for complete search history.

(56) References Cited

U.S. PATENT DOCUMENTS

| | | | |
|---|---|---|---|
| 4,766,677 A * | 8/1988 | Brooks ................. | B23K 1/015 34/242 |
| 6,116,491 A | 9/2000 | Katoh | |
| (Continued) | | | |

FOREIGN PATENT DOCUMENTS

| | | | |
|---|---|---|---|
| CN | 1516543 A | * | 7/2004 |
| CN | 203992716 U | * | 12/2014 |
| (Continued) | | | |

*Primary Examiner* — Kiley S Stoner
(74) *Attorney, Agent, or Firm* — Myers Bigel, P.A.

(57) ABSTRACT

A solder reflow apparatus may include a reflow chamber, a heater and a stage. The reflow chamber may be configured to receive a heat transfer fluid. The heat transfer fluid may be configured for transferring heat to a solder for mounting an electronic part on a substrate. The heater may be configured to heat the heat transfer fluid in the reflow chamber. The stage may be in the reflow chamber to support the substrate. The stage may be inclined to a bottom surface of the reflow chamber to induce the heat transfer fluid toward a central portion of the substrate. Thus, the vertically ascended heat transfer fluid may be uniformly applied to the central portion and an edge portion of the substrate so that the solders at the central portion and the edge portion of the substrate may be uniformly soldered.

20 Claims, 9 Drawing Sheets

(56) References Cited

U.S. PATENT DOCUMENTS

| | | |
|---|---|---|
| 6,805,282 B2 | 10/2004 | Kawashima et al. |
| 7,416,103 B2 | 8/2008 | Kaneko |
| 7,748,600 B2 | 7/2010 | Leicht |
| 10,086,460 B2 | 10/2018 | Colijn |
| 2003/0024963 A1* | 2/2003 | Fujii .................... B23K 1/0016 228/49.5 |
| 2003/0168495 A1* | 9/2003 | Biedorf ................ B23K 1/0016 228/248.1 |
| 2008/0067219 A1 | 3/2008 | Barengo et al. |
| 2015/0209885 A1 | 7/2015 | Zhang et al. |
| 2024/0113067 A1* | 4/2024 | Kim ........................ H01L 24/75 |
| 2024/0145259 A1* | 5/2024 | Kim .................. H01L 21/68764 |
| 2024/0293884 A1* | 9/2024 | Kim ........................ H01L 21/56 |
| 2024/0363579 A1* | 10/2024 | Oh ........................ B23K 3/0471 |

FOREIGN PATENT DOCUMENTS

| | | | | |
|---|---|---|---|---|
| CN | 107214447 A | * | 9/2017 | ............. B23K 37/00 |
| CN | 108176907 A | * | 6/2018 | ................ B23K 3/04 |
| CN | 208227477 U | * | 12/2018 | |
| CN | 112719501 A | * | 4/2021 | ............. B23K 1/008 |
| DE | 10203112 A1 | * | 8/2003 | ........... B23K 1/0016 |
| EP | 0218391 A1 | * | 4/1987 | |
| EP | 3851235 A1 | * | 7/2021 | ............. B23K 1/015 |
| JP | 2010161206 A | * | 7/2010 | ............. H05K 3/341 |
| KR | 100417886 B1 | | 6/2004 | |
| WO | WO-2022018133 A1 | * | 1/2022 | ........... C23C 14/246 |

\* cited by examiner

SOLDER REFLOW APPARATUS

CROSS-RELATED APPLICATION

This application claims priority under 35 USC § 119 to Korean Patent Application No. 10-2022-0133177, filed on Oct. 17, 2022 in the Korean Intellectual Property Office (KIPO), the contents of which are herein incorporated by reference in their entirety.

BACKGROUND

Example embodiments relate to a solder reflow apparatus. More particularly, example embodiments relate to a solder reflow apparatus using a vapor phase soldering.

In a surface mount technology, a convection reflow, a laser assisted bonding, a vapor phase soldering, etc., may be used for soldering a solder paste. In the vapor phase soldering, a heated heat transfer fluid may transfer heat to a solder for mounting an electronic part such as a semiconductor chip on a substrate. After transferring the heat, the heat transfer fluid may be condensed to form a liquid.

According to related arts, densities of the heat transfer fluid at a same height in a reflow chamber may be equal to each other. Thus, a heat transfer time of the heat transfer fluid to a solder at an edge portion of the substrate may be faster than a heat transfer time of the heat transfer fluid to the solder at a central portion of the substrate so that heat applied to the solder at the central portion of the substrate may be later than heat applied to the solder at the edge portion of the substrate. As a result, when the solder at the edge portion may be soldered, the solder at the central portion of the substrate may not be soldered.

SUMMARY

Example embodiments provide a solder reflow apparatus that may be capable of uniformly applying a heat transfer fluid to an edge portion and a central portion of a substrate.

According to example embodiments, a solder reflow apparatus may include a reflow chamber, a heater and a stage. The reflow chamber may be configured to receive a heat transfer fluid. The heat transfer fluid may be configured for transferring heat to a solder for mounting an electronic part on a substrate. The heater may be configured to heat the heat transfer fluid in the reflow chamber. The stage may be in the reflow chamber to support the substrate. The stage may be inclined to a bottom surface of the reflow chamber to induce the heat transfer fluid toward a central portion of the substrate.

According to example embodiments, a solder reflow apparatus may include a reflow chamber, a heater, a stage and a rotary driver. The reflow chamber may be configured to receive a heat transfer fluid. The heat transfer fluid may be configured for transferring heat to a solder for mounting an electronic part on a substrate. The heater may be configured to heat the heat transfer fluid in the reflow chamber. The stage may be in the reflow chamber to support the substrate. The rotary driver may be configured to rotate the stage with respect to a horizontal axis to incline the stage at an inclined angle with respect to a bottom surface of the reflow chamber, thereby inducing the heat transfer fluid toward a central portion of the substrate on the stage.

According to example embodiments, a solder reflow apparatus may include a reflow chamber, a heater, a stage and a guide. The reflow chamber may be configured to receive a heat transfer fluid. The heat transfer fluid may be configured for transferring heat to a solder for mounting an electronic part on a substrate. The heater may be configured to heat the heat transfer fluid in the reflow chamber. The stage may be in the reflow chamber and configured to support the substrate. The guide may be in the reflow chamber and configured to direct the heat transfer fluid toward a central portion of the substrate on the stage.

According to example embodiments, the stage may be inclined to the bottom surface of the reflow chamber to induce the heat transfer fluid to the central portion of the substrate on an upper surface of the stage. According to example embodiments, the guide may direct the heat transfer fluid to the central portion of the substrate on the stage. Thus, the vertically ascended heat transfer fluid may be uniformly applied to the central portion and an edge portion of the substrate so that the solders at the central portion and the edge portion of the substrate may be uniformly soldered.

BRIEF DESCRIPTION OF THE DRAWINGS

Example embodiments will be more clearly understood from the following detailed description taken in conjunction with the accompanying drawings.

FIG. 1 is a cross-sectional view illustrating a solder reflow apparatus in accordance with example embodiments;

FIG. 2 is a cross-sectional view illustrating an ascended stage in the solder reflow apparatus in FIG. 1;

FIG. 3 is a cross-sectional view illustrating a solder reflow apparatus in accordance with example embodiments;

FIG. 4 is a cross-sectional view illustrating a solder reflow apparatus in accordance with example embodiments;

FIG. 5 is a cross-sectional view illustrating a solder reflow apparatus in accordance with example embodiments;

FIG. 6 is a plan view illustrating the solder reflow apparatus in FIG. 5;

FIG. 7 is a cross-sectional view illustrating a solder reflow apparatus in accordance with example embodiments;

FIG. 8 is a plan view illustrating the solder reflow apparatus in FIG. 7; and FIG. 9 is a flow chart illustrating a method of manufacturing a semiconductor package using the solder reflow apparatus in FIG. 1.

DETAILED DESCRIPTION

Hereinafter, example embodiments will be explained in detail with reference to the accompanying drawings.

Figure 1:
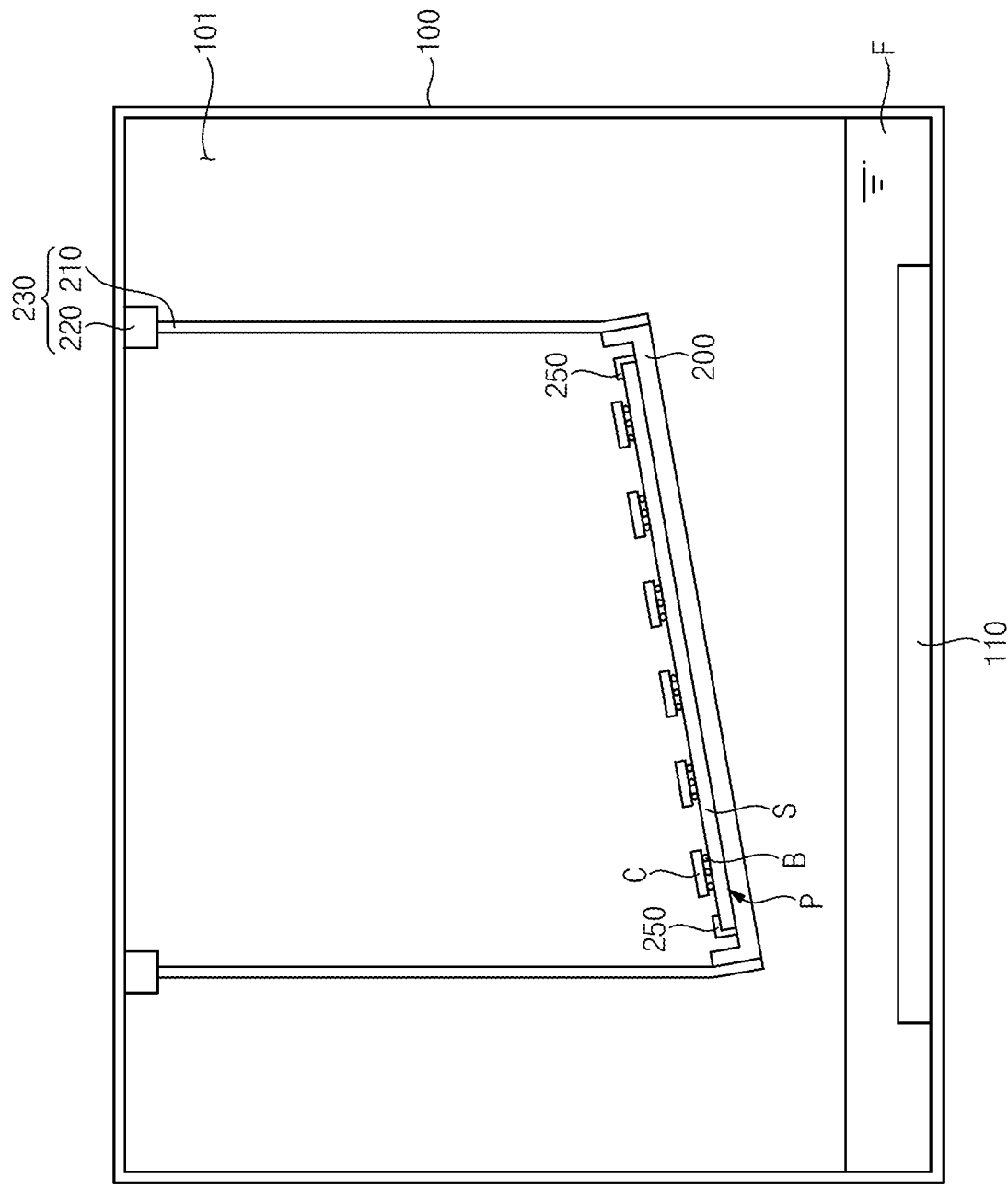
FIGS. 1 to 9 represent non-limiting, example embodiments as described herein.
Figure 2:
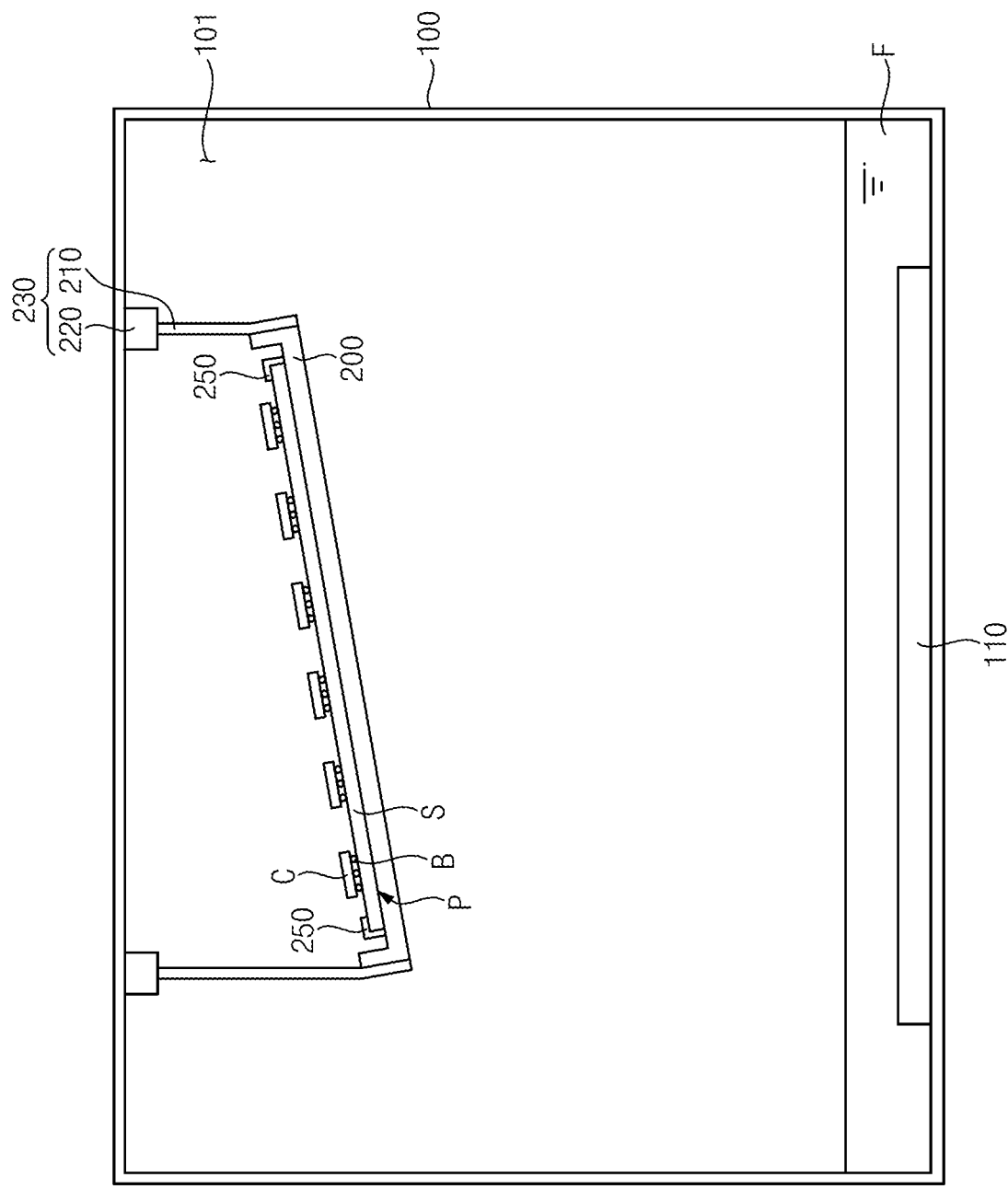

FIG. 1 is a cross-sectional view illustrating a solder reflow apparatus in accordance with example embodiments and FIG. 2 is a cross-sectional view illustrating an ascended stage in the solder reflow apparatus in FIG. 1.

Referring to FIGS. 1 and 2, a solder reflow apparatus may be used for soldering an electronic part on a substrate. For example, the solder reflow apparatus may be used for manufacturing a semiconductor package P. Particularly, the semiconductor package P may include a package substrate S, a semiconductor chip C, conductive bumps B, etc. The package substrate S may correspond to the substrate. The semiconductor chip C may correspond to the electronic part. The conductive bumps B may be interposed between the package substrate S and the semiconductor chip C. The conductive bumps B may be attached to the package substrate S and the semiconductor chip C by a soldering process performed by the solder reflow apparatus.

The solder reflow apparatus may include a reflow chamber 100, a heater 110, a stage 200 and a lifter or lifting system 230. The solder reflow apparatus may further include a temperature sensor configured to monitor a temperature in the reflow chamber 100.

In example embodiments, the solder reflow apparatus may correspond to a vapor phase soldering type apparatus configured for soldering a solder paste by a heated saturated vapor in the reflow chamber 100.

The reflow chamber 100 may include a reservoir configured to receive a heat transfer fluid F. The reservoir may be a lower region in the reflow chamber 100. The reflow chamber 100 may include a space 101 filled with a gas generated by heating the heat transfer fluid F. The space 101 may be a remaining space in the reflow chamber 100 except for the reservoir. The reflow chamber 100 may extend in a vertical direction to have a height. The vapor, which may be generated by evaporating the heat transfer fluid F, may move upwardly or be upwardly moved. The vapor may be condensed to form a liquid. The liquid may move downwardly or be downwardly moved. The liquid may then be collected in the reservoir.

An internal pressure of the reflow chamber 100 may be an atmospheric pressure. Alternatively, the reflow chamber 100 may be connected to an exhaust apparatus such as a vacuum pump to control the internal pressure of the reflow chamber 100. The internal pressure of the reflow chamber 100 may be maintained for changing a boiling point of the heat transfer fluid F or for soldering environments.

The heat transfer fluid F may be a chemical for providing the vapor required for the soldering. The heat transfer fluid F may be selected in accordance with the boiling point of the heat transfer fluid F, environmental influences, corrosiveness of the vapor, etc. The heat transfer fluid F may include an inert organic liquid. For example, the heat transfer fluid F may include a Galden solution in perfluoropolyether (PFPE). The Galden solution may have a boiling point of about 230° C.

The heater 110 may heat the heat transfer fluid F in the reflow chamber 100 to generate a saturated vapor. The heater 110 may include an electrical resistor dipped into or submerged in the heat transfer fluid F on a bottom surface of the reflow chamber 100. Alternatively, the heater 110 may include a coil-shaped resistor configured to surround the reservoir.

Additionally, a heater as a part of a temperature controller may be installed at a sidewall of the reflow chamber 100 to control internal temperatures of the reflow chamber 100.

The stage 200 may be movably arranged in the reflow chamber 100 in the vertical direction. The lifter 230 may lift the stage 200. The lifter 230 may include an actuator such as a transfer rail, a transfer screw, a transfer belt, etc. Transfer rods 210 may support both ends of the stage 200. A linear actuator 220 may lift the stage 200 along the transfer rods 210.

In example embodiments, the stage 200 may be slantly arranged. Particularly, the stage 200 may be inclined toward a bottom surface of the reflow chamber 100. That is, the stage 200 may not be parallel to the bottom surface of the reflow chamber 100. An inclined angle of the stage 200 with respect to the bottom surface of the reflow chamber 100 may be an acute angle, but the disclosure is not limited thereto. The inclined angle of the stage 200 may be determined in accordance with soldering difference of the solders by positions of the substrate such as an ascent speed of the vapor, an amount of the vapor, etc.

A clamp 250 may be configured to fix the substrate on an upper surface of the stage 200. In example embodiments, because the stage 200 may be slanted, the substrate may tend to slip on the upper surface of the stage 200. The clamp 250 may fix the substrate on the stage 200 to prevent the slip of the substrate. The clamp 250 may include various types configured to fix the substrate.

The substrate on the stage 200 may also be slanted by the inclined stage 200. That is, an inclined angle of the substrate with respect to the bottom surface of the reflow chamber 100 may be substantially the same as the inclined angle of the stage 200 with respect to the bottom surface of the reflow chamber 100.

The vapor generated from the heat transfer fluid F may be upwardly moved through an outskirt of the horizontal stage 200 in the vertical direction. Thus, after the vapor may be previously applied to the edge portion of the substrate, the vapor may then be applied to the central portion of the substrate. That is, a time that the vapor may reach the central portion of the substrate may be later than a time that the vapor may reach the edge portion of the substrate. Thus, a heat amount transferred to the central portion of the substrate from the vapor may be lower than a heat amount transferred to the edge portion of the substrate. As a result, when the solder at the edge portion of the substrate may be previously soldered, the solder at the central portion of the substrate may not be soldered.

In order to solve the above-mentioned problem, the inclined angle of the stage 200 may provide the substrate with the inclined angle. A part of the ascended vapor may be effectively moved to the central portion of the inclined substrate from the edge portion of the inclined substrate. Thus, the vapor may be rapidly applied to the central portion of the substrate. Therefore, the heat amount transferred to the central portion of the substrate from the vapor may be similar to the heat amount transferred to the edge portion of the substrate from the vapor. As a result, the solders at the edge portion and the central portion of the substrate may be uniformly soldered.

Figure 3:
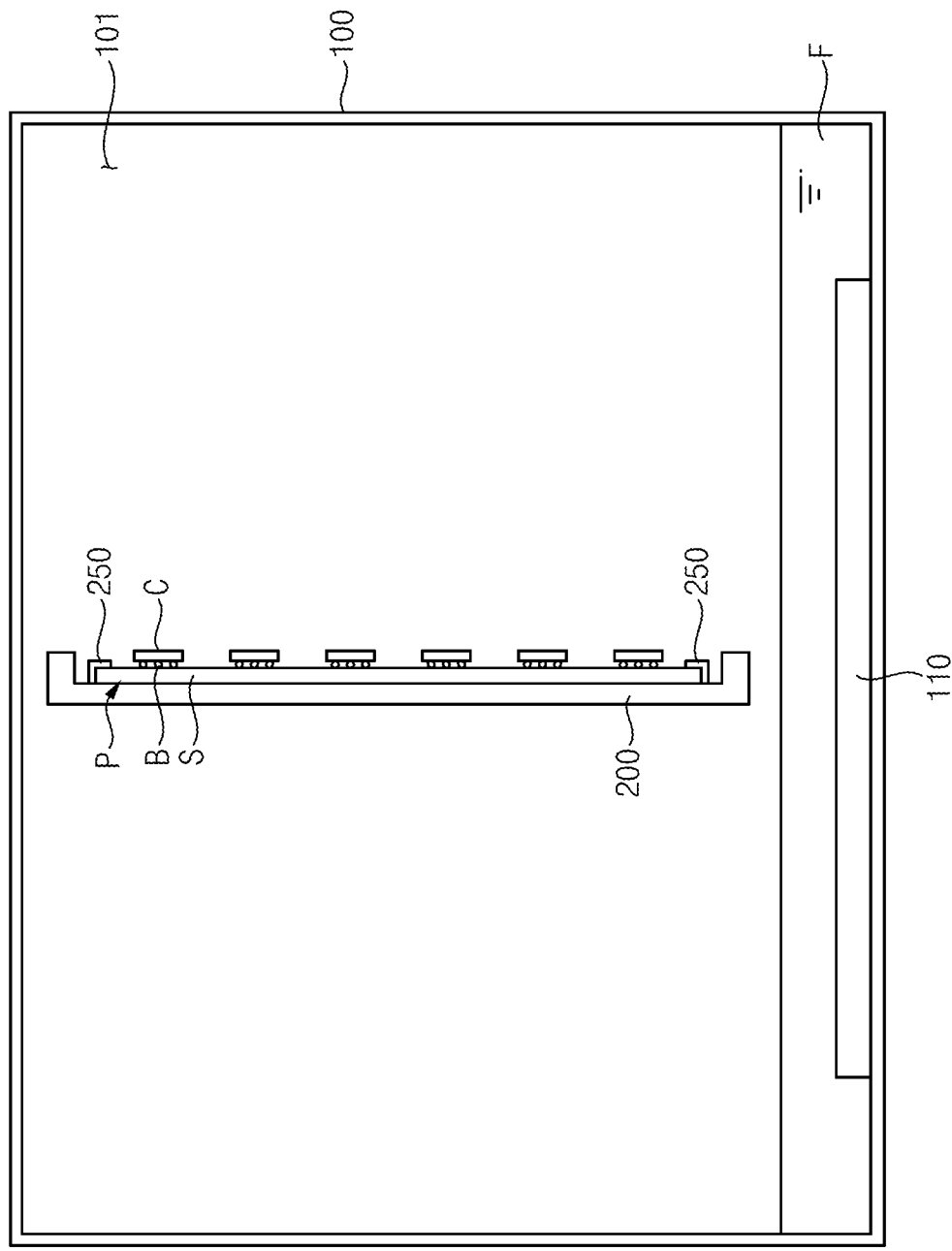

FIG. 3 is a cross-sectional view illustrating a solder reflow apparatus in accordance with example embodiments.

A solder reflow apparatus of example embodiments may include elements substantially the same as those of the solder reflow apparatus in FIG. 1 except for a stage. Thus, the same reference numerals may refer to the same elements and any further illustrations or description with respect to the same elements may be omitted herein for brevity.

Referring to FIG. 3, a stage 200 of example embodiments may be inclined with respect to the bottom surface of the reflow chamber 100 at an angle of about 90°. That is, the stage 200 may be substantially perpendicular to the bottom surface of the reflow chamber 100. Thus, the substrate may also be perpendicular to the bottom surface of the reflow chamber 100.

Therefore, the part of the ascended vapor may be rapidly and effectively applied to the central portion of the vertical substrate. Thus, the heat amount transferred to the central portion of the substrate from the vapor may be more similar to the heat amount transferred to the edge portion of the substrate from the vapor. As a result, the solders at the edge portion and the central portion of the substrate may be more uniformly soldered.

Figure 4:
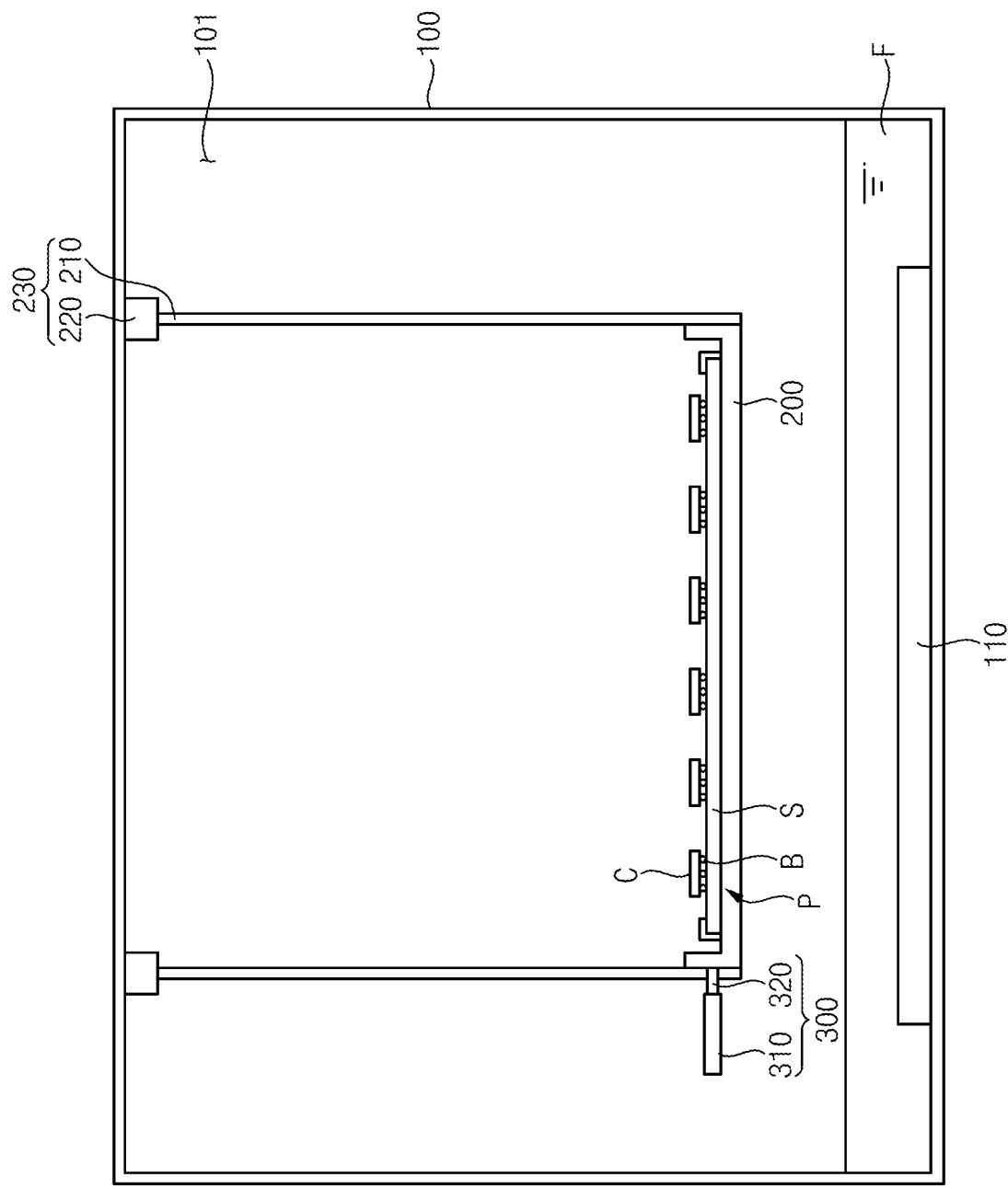

FIG. 4 is a cross-sectional view illustrating a solder reflow apparatus in accordance with example embodiments.

A solder reflow apparatus of example embodiments may include elements substantially the same as those of the solder reflow apparatus in FIG. 1 except for further including a rotary driver. Thus, the same reference numerals may refer to the same elements and any further illustrations or description with respect to the same elements may be omitted herein for brevity.

Referring to FIG. 4, the solder reflow apparatus of example embodiments may further include a rotary driver 300 in the reflow chamber 100. The rotary driver 300 may rotate or tilt the stage 200 with respect to the horizontal axis. That is, the rotary driver 300 may rotate the stage 200 with respect to the horizontal axis to provide the stage 200 with an inclined angle with respect to the bottom surface of the reflow chamber 100. The inclined angle of the stage 200 provided by the rotary driver 300 may be no more than about 90°, but the disclosure is not limited thereto.

In example embodiments, the rotary driver 300 may include an actuator 310 and a rod 320. The actuator 310 may generate a rotary force with respect to the horizontal axis. The actuator 310 may include a motor, a cylinder, etc., but the disclosure is not limited thereto. The rod 320 may transfer the rotary force generated from the actuator 310 to the stage 200. The rod 320 may be connected to a side surface of the stage 200, but the disclosure is not limited thereto.

The stage 200 rotated by the rotary driver 300 may have the structure or orientation shown in FIG. 1 or FIG. 3. Particularly, the rotary driver 300 may provide the stage 200 with a desired inclined angle in accordance with a soldering ratio of the solders by the positions.

Figure 5:
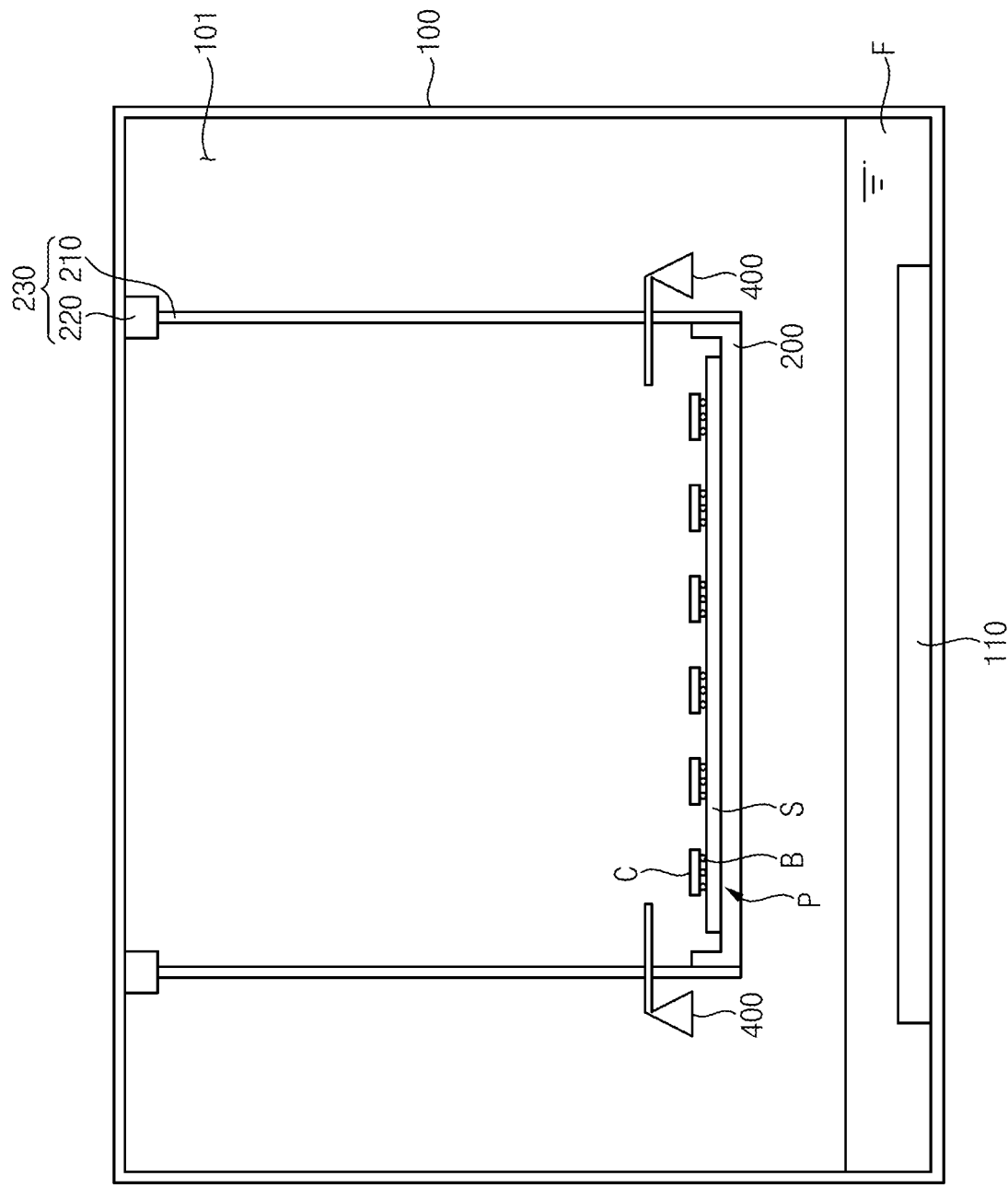
Figure 6:
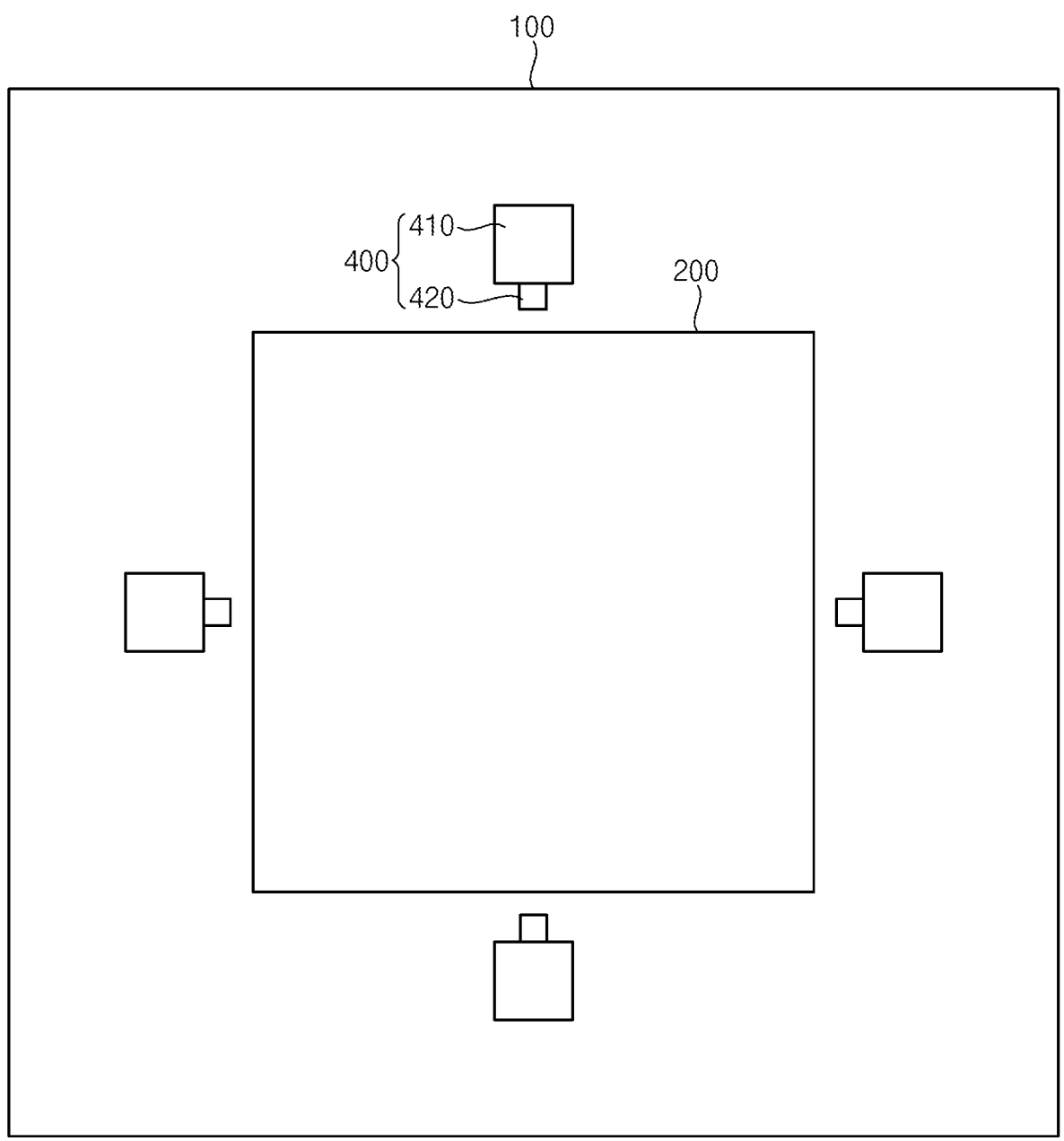

FIG. 5 is a cross-sectional view illustrating a solder reflow apparatus in accordance with example embodiments and FIG. 6 is a plan view illustrating the solder reflow apparatus in FIG. 5.

A solder reflow apparatus of example embodiments may include elements substantially the same as those of the solder reflow apparatus in FIG. 1 except for further including a guide. Thus, the same reference numerals may refer to the same elements and any further illustrations or description with respect to the same elements may be omitted herein for brevity.

Referring to FIGS. 5 and 6, the solder reflow apparatus of example embodiments may further include a guide. The guide may be arranged at a side surface of the stage 200 in the reflow chamber 100 to induce or direct or guide the heat transfer fluid F, particularly, the vapor generated from the heat transfer fluid F toward the central portion of the substrate on the stage 200.

In example embodiments, the guide may include at least one funnel 400. The funnel 400 may include a body 410 and an outlet 420 such as an outlet tube or pipe formed at an upper surface or upper end of the body 410. The outlet 420 may have a width narrower than a width of the body 410. Particularly, the outlet 420 of the funnel 400 may be oriented toward the central portion of the substrate on the stage 200. Thus, the vapor introduced into the funnel 400 may be induced to the central portion of the substrate through the outlet 420 of the funnel 400.

Further, the funnel 400 may include a plurality of the funnels 400 configured to surround the stage 200. The outlets 420 of the funnels 400 may be oriented toward the central portion of the substrate. In order to prevent the upward flow of the vapor from being blocked, the funnels 400 may be spaced apart from each other by a sufficient gap.

The funnel 400 of example embodiments may be applied to the horizontal stage 200. Alternatively, the funnel 400 of example embodiments may be applied to the solder reflow apparatus in FIG. 1 or FIG. 3.

Figure 7:
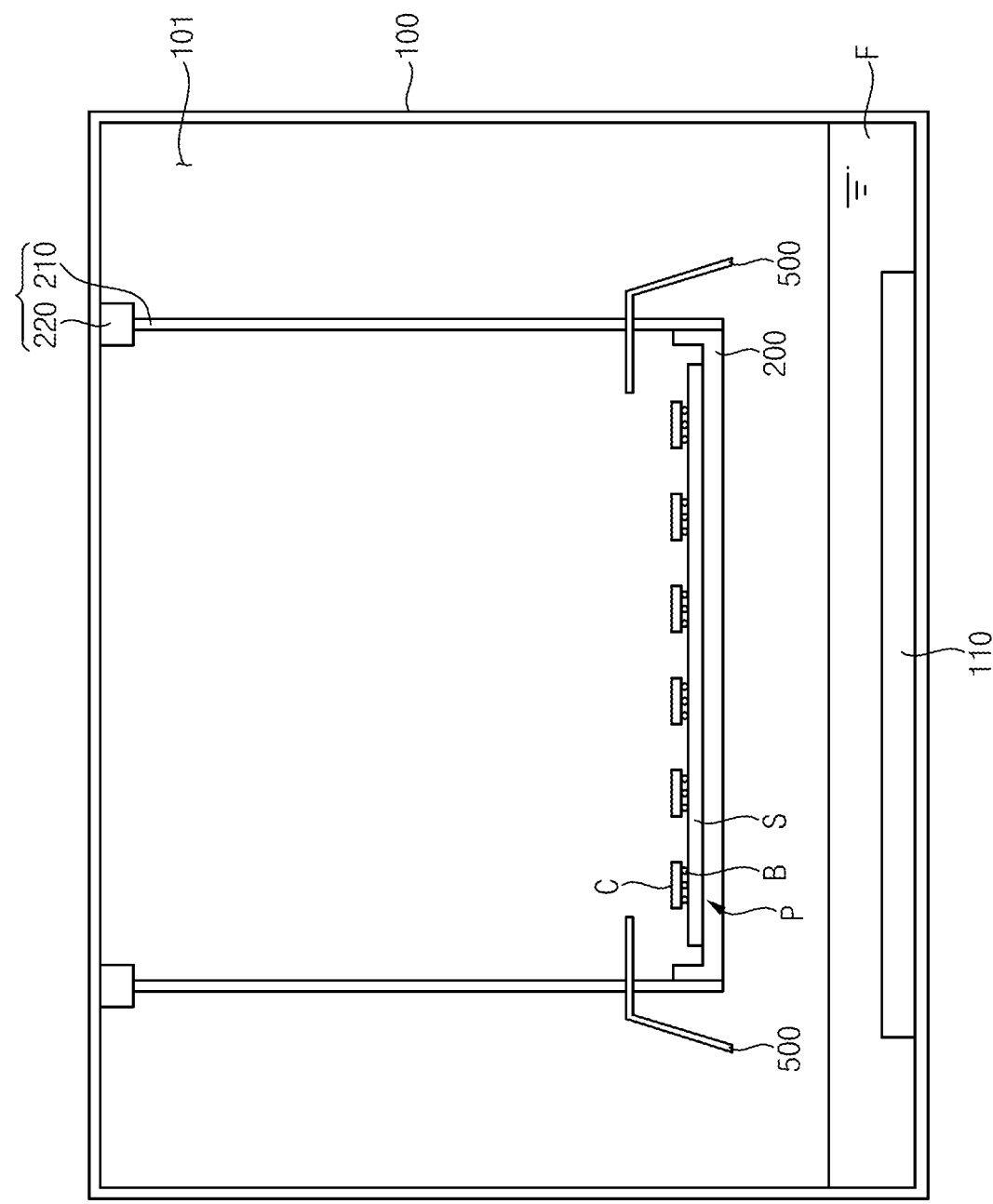
Figure 8:
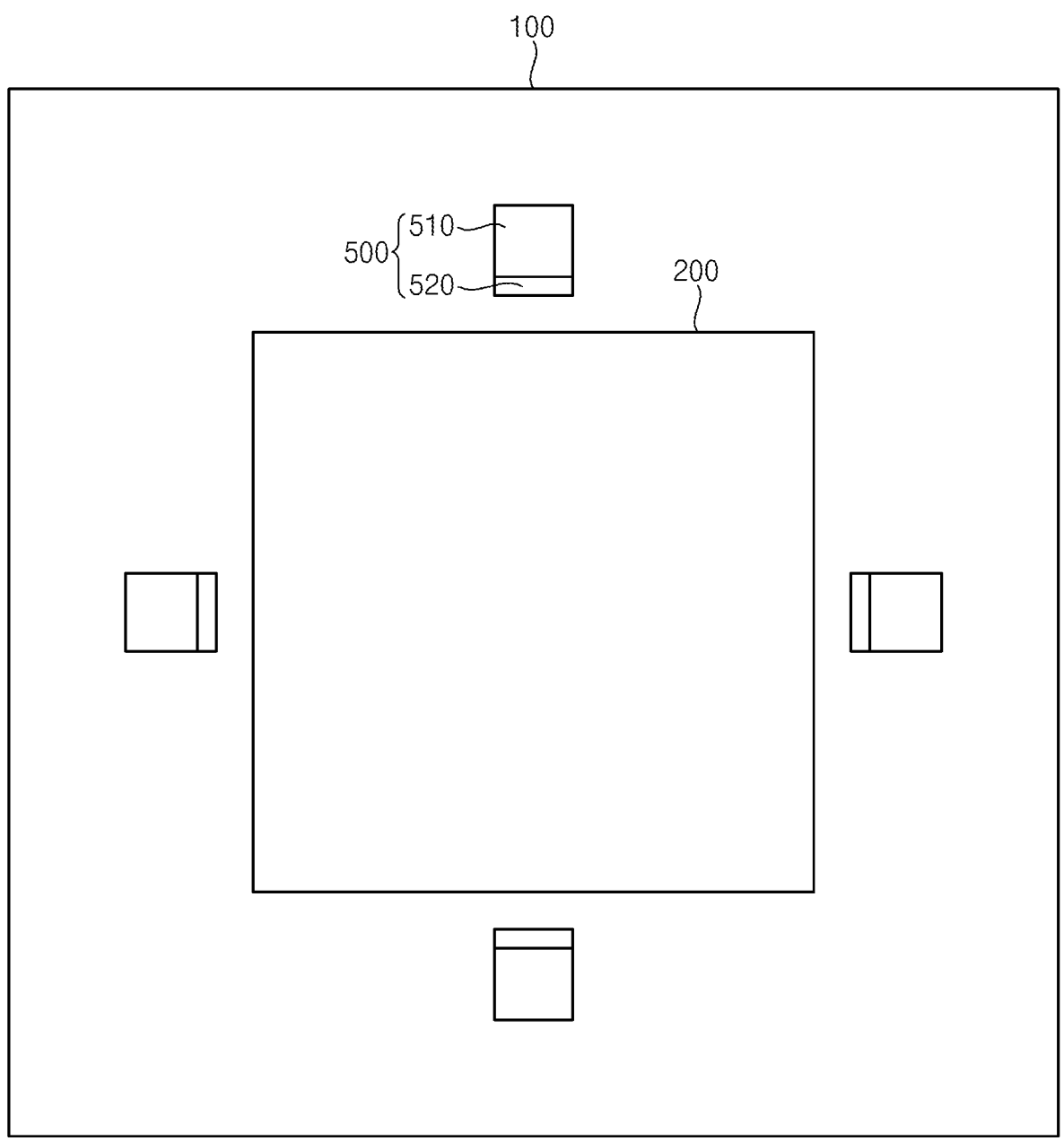

FIG. 7 is a cross-sectional view illustrating a solder reflow apparatus in accordance with example embodiments and FIG. 8 is a plan view illustrating the solder reflow apparatus in FIG. 7.

A solder reflow apparatus of example embodiments may include elements substantially the same as those of the solder reflow apparatus in FIG. 5 except for a guide. Thus, the same reference numerals may refer to the same elements and any further illustrations or description with respect to the same elements may be omitted herein for brevity.

Referring to FIGS. 7 and 8, the guide may include at least one eave 500. The eave 500 may include an inclined guiding portion or inclined portion 510 and a horizontal guiding portion or horizontal portion 520. The inclined guiding portion 510 may be inclined to the upward direction of the vapor, i.e., the vertical direction. The horizontal guiding portion 520 may be horizontally extended or horizontally extend from an upper end of the inclined guiding portion 510 toward the central portion of the substrate. Thus, the ascended vapor may be induced or directed or guided to the central portion of the substrate by a lower surface of the inclined guiding portion 510 and a lower surface of the horizontal guiding portion 520.

Further, the eave 500 may include a plurality of the eaves 500 configured to surround the stage 200. The horizontal guiding portions 520 of the eaves 500 may be oriented toward the central portion of the substrate. In order to prevent the upward flow of the vapor from being blocked, the eaves 500 may be spaced apart from each other by a sufficient gap.

The eave 500 of example embodiments may be applied to the horizontal stage 200. Alternatively, the eave 500 of example embodiments may be applied to the solder reflow apparatus in FIG. 1 or FIG. 3.

Figure 9:
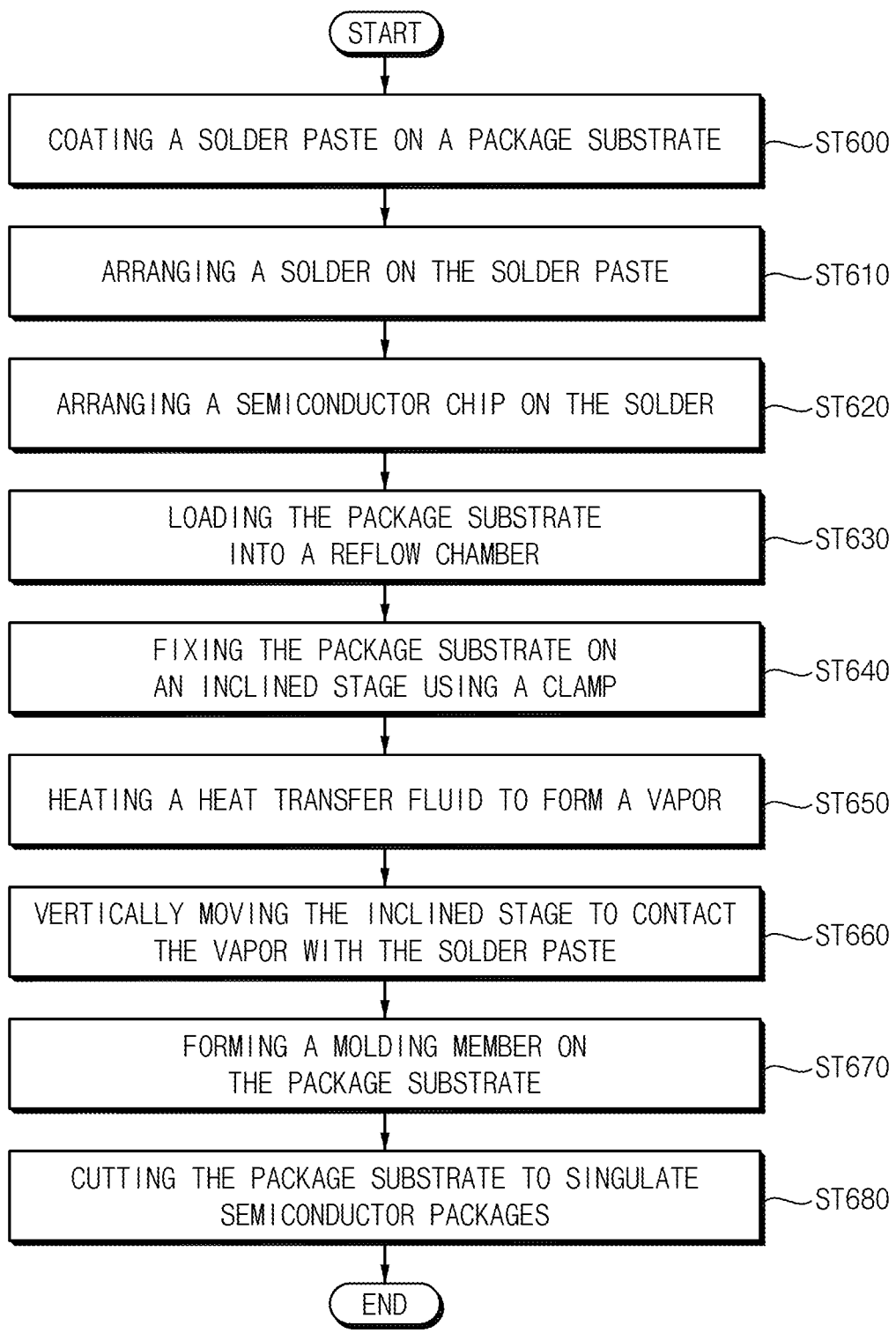

FIG. 9 is a flow chart illustrating a method of manufacturing a semiconductor package using the solder reflow apparatus in FIG. 1.

Referring to FIGS. 1 and 9, in step ST600, the solder paste may be coated on the upper surface of the package substrate S.

In example embodiments, the solder paste may be printed on the package substrate S. For example, the solder paste may be printed by a stencil printer. The stencil may have a plurality of holes corresponding to an arrangement of the conductive bumps B.

In step ST610, the solder may be arranged on the solder paste.

In step ST620, the semiconductor chip C may be arranged on the solder.

In step ST630, the package substrate S with the semiconductor chip C may be loaded into the reflow chamber 100. The package substrate S may be placed on the upper surface of the inclined stage 200. Thus, the package substrate S may also be inclined in accordance with the inclined angle of the stage 200.

In step ST640, the clamp 250 may fix the package substrate S on the stage 200.

In step ST650, the heater 110 may heat the heat transfer fluid F to form the vapor from the heat transfer fluid F.

In step ST660, the lifter 230 may upwardly move the inclined stage 200 to contact the vapor with the solder paste. The part of the ascended vapor may be effectively moved from the edge portion of the inclined package substrate S to the central portion of the inclined package substrate S. Thus, the vapor may be rapidly provided to the central portion of the package substrate S. Therefore, the heat amount transferred to the central portion of the package substrate S from the vapor may be similar to the heat amount transferred to the edge portion of the package substrate S from the vapor. As a result, the solders at the edge portion and the central portion of the package substrate S may be uniformly soldered.

The solder paste may be heated to reflow the solder, thereby forming the conductive bumps B between the package substrate S and the semiconductor chip C.

In step ST670, a molding member may be formed on the package substrate S to cover the semiconductor chip C.

In step ST680, the package substrate S may be cut along scribe lanes to singulate the semiconductor packages P.

By the above-mentioned processes, the semiconductor package P including a logic device or a memory device and a semiconductor module including the semiconductor package P may be manufactured. For example, the semiconductor package P may include the logic device such as a central processing unit (CPU), an application processor (AP), etc., a volatile memory device such as an SRAM device, a DRAM device, an HBM device, etc., and a non-volatile memory device such as a flash memory device, a PRAM device, an MRAM device, an RRAM device.

According to example embodiments, the stage may be inclined relative to the bottom surface of the reflow chamber to induce the heat transfer fluid to the central portion of the substrate on an upper surface of the stage. A guide may induce the heat transfer fluid to the central portion of the substrate on the stage. Thus, the vertically ascended heat transfer fluid may be uniformly applied to the central portion and an edge portion of the substrate so that the solders at the central portion and the edge portion of the substrate may be uniformly soldered.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures.

What is claimed is:

1. A solder reflow apparatus comprising:
   a reflow chamber configured to receive a heat transfer fluid, the heat transfer fluid configured for transferring heat to a solder for mounting an electronic part on a substrate;
   a heater configured to heat the heat transfer fluid in the reflow chamber; and
   a stage in the reflow chamber to support the substrate, the stage inclined with respect to a bottom surface of the reflow chamber to induce the heat transfer fluid toward a central portion of the substrate;
   a rotary driver configured to rotate the stage with respect to a horizontal axis; and
   a lifter configured to lift the inclined stage vertically.

2. The solder reflow apparatus of claim 1, wherein an inclined angle between the stage and the bottom surface of the reflow chamber is no more than about 90°.

3. The solder reflow apparatus of claim 1, further comprising at least one clamp configured to fix the substrate on the stage.

4. The solder reflow apparatus of claim 1, wherein the rotary driver comprises:
   an actuator configured to generate a rotary force with respect to the horizontal axis; and
   a rod configured to transfer the rotary force of the actuator to the stage.

5. The solder reflow apparatus of claim 4, wherein the rod is connected to a side surface of the stage.

6. The solder reflow apparatus of claim 1, wherein the substrate comprises a package substrate and the electronic part comprises a semiconductor chip.

7. A solder reflow apparatus comprising:
   a reflow chamber configured to receive a heat transfer fluid, the heat transfer fluid configured for transferring heat to a solder for mounting an electronic part on a substrate;
   a heater configured to heat the heat transfer fluid in the reflow chamber; and
   a stage in the reflow chamber to support the substrate; and
   a rotary driver configured to rotate the stage with respect to a horizontal axis to incline the stage at an inclined angle with respect to a bottom surface of the reflow chamber, thereby inducing the heat transfer fluid toward a central portion of the substrate.

8. The solder reflow apparatus of claim 7, wherein the inclined angle is no more than about 90°.

9. The solder reflow apparatus of claim 7, further comprising at least one clamp configured to fix the substrate on the stage.

10. The solder reflow apparatus of claim 7, wherein the rotary driver comprises:
    an actuator configured to generate a rotary force with respect to the horizontal axis; and
    a rod configured to transfer the rotary force of the actuator to the stage.

11. The solder reflow apparatus of claim 10, wherein the rod is connected to a side surface of the stage.

12. The solder reflow apparatus of claim 7, further comprising a lifter configured to lift the stage vertically.

13. A solder reflow apparatus comprising:
    a reflow chamber configured to receive a heat transfer fluid, the heat transfer fluid configured for transferring heat to a solder for mounting an electronic part on a substrate;
    a heater configured to heat the heat transfer fluid in the reflow chamber; and
    a stage in the reflow chamber to support the substrate;
    a rotary driver configured to rotate the stage with respect to a horizontal axis to incline the stage at an inclined angle with respect to a bottom surface of the reflow chamber, thereby inducing the heat transfer fluid toward a central portion of the substrate; and
    a guide in the reflow chamber and configured to direct the heat transfer fluid toward the central portion of the substrate.

14. The solder reflow apparatus of claim 13, wherein the guide comprises at least one funnel at a side surface of the stage, the funnel comprising a body and an outlet at an upper end of the body that is directed or oriented toward the central portion of the substrate.

15. The solder reflow apparatus of claim 14, wherein the at least one funnel comprises a plurality of funnels configured to surround the stage.

16. The solder reflow apparatus of claim 13, wherein the guide comprises at least one eave at a side surface of the stage, the eave comprising an inclined portion and a horizontal portion extending from the inclined portion toward the central portion of the substrate.

17. The solder reflow apparatus of claim 16, wherein the at least one eave comprises a plurality of eaves configured to surround the stage.

18. The solder reflow apparatus of claim 13, further comprising a lifter configured to lift the stage.

19. The solder reflow apparatus of claim 13, wherein the rotary driver comprises:
   an actuator configured to generate a rotary force with respect to the horizontal axis; and
   a rod configured to transfer the rotary force of the actuator to the stage.

20. The solder reflow apparatus of claim 19, wherein the rod is connected to a side surface of the stage.

* * * * *